US006809383B2

(12) United States Patent
Frisina

(10) Patent No.: US 6,809,383 B2
(45) Date of Patent: Oct. 26, 2004

(54) METHOD OF MANUFACTURING AN INTEGRATED EDGE STRUCTURE FOR HIGH VOLTAGE SEMICONDUCTOR DEVICES, AND RELATED INTEGRATED EDGE STRUCTURE

(75) Inventor: Ferruccio Frisina, S. Agata Li Battiati (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 83 days.

(21) Appl. No.: 09/925,080

(22) Filed: Aug. 8, 2001

(65) Prior Publication Data

US 2001/0053589 A1 Dec. 20, 2001

Related U.S. Application Data

(62) Division of application No. 09/457,069, filed on Dec. 7, 1999, now Pat. No. 6,300,171, and a division of application No. 09/703,263, filed on Oct. 31, 2000, now abandoned.

(30) Foreign Application Priority Data

Dec. 9, 1998 (EP) .............................................. 98830739

(51) Int. Cl.[7] .......................... H01L 29/74; H01L 23/62; H01L 29/76; H01L 29/06; H01L 21/425
(52) U.S. Cl. ....................... 257/355; 257/401; 257/409; 257/139; 257/168; 257/653
(58) Field of Search ................................ 257/341, 168, 257/409, 495, 653, 401, 342, 139, 133, 149, 147, 155, 355, 135

(56) References Cited

U.S. PATENT DOCUMENTS 5,075,739 A * 12/1991 Davies ........................ 257/170
5,489,799 A * 2/1996 Zambrano et al. ........... 257/587

(List continued on next page.)

FOREIGN PATENT DOCUMENTS

| EP | 0 413 256 A | 2/1991 |
|----|----|----|
| EP | 0 757 382 A | 2/1997 |
| GB | 2 163 597 A | 2/1986 |

OTHER PUBLICATIONS

European Search Report from European Patent Application 98830739.3, filed Dec. 9, 1998.

(List continued on next page.)

*Primary Examiner*—Matthew Smith
*Assistant Examiner*—Chuong Anh Luu
(74) *Attorney, Agent, or Firm*—Lisa K. Jorgenson; James H. Morris; Wolf, Greenfield & Sacks, P.C.

(57) ABSTRACT

Method of manufacturing an edge structure for a high voltage semiconductor device, including a first step of forming a first semiconductor layer of a first conductivity type, a second step of forming a first mask over the top surface of the first semiconductor layer, a third step of removing portions of the first mask in order to form at least one opening in it, a fourth step of introducing dopant of a second conductivity type in the first semiconductor layer through the at least one opening, a fifth step of completely removing the first mask and of forming a second semiconductor layer of the first conductivity type over the first semiconductor layer, a sixth step of diffusing the dopant implanted in the first semiconductor layer in order to form a doped region of the second conductivity type in the first and second semiconductor layers. The second step up to the sixth step are repeated at least one time in order to form a final edge structure including a number of superimposed semiconductor layers of the first conductivity type and at least two columns of doped regions of the second conductivity type, the columns being inserted in the number of superimposed semiconductor layers and formed by superimposition of the doped regions subsequently implanted through the mask openings, the column near the high voltage semiconductor device being deeper than the column farther from the high voltage semiconductor device.

28 Claims, 5 Drawing Sheets

U.S. PATENT DOCUMENTS

| | | | | |
|---|---|---|---|---|
| 5,594,261 A | * | 1/1997 | Temple | 257/140 |
| 5,633,180 A | | 5/1997 | Bajor | |
| 5,719,411 A | * | 2/1998 | Ajit | 257/132 |
| 5,796,156 A | * | 8/1998 | Leonardi et al. | 257/494 |
| 5,798,187 A | | 8/1998 | Wilson et al. | |
| 5,841,197 A | * | 11/1998 | Adamic, Jr. | 257/777 |
| 5,895,249 A | * | 4/1999 | Zambrano et al. | 438/356 |
| 5,900,662 A | | 5/1999 | Frisina et al. | |
| 5,963,798 A | | 10/1999 | Kim et al. | |
| 5,969,400 A | * | 10/1999 | Shinohe et al. | 257/492 |
| 6,010,926 A | | 1/2000 | Rho et al. | |
| 6,054,743 A | * | 4/2000 | Maekawa | 257/408 |
| 6,225,165 B1 | * | 5/2001 | Noble et al. | 438/268 |
| 6,300,171 B1 | * | 10/2001 | Frisina | 438/140 |

OTHER PUBLICATIONS

Patent Abstracts of Japan, vol. 006, No. 264 (E–150), Dec. 23, 1982 & JP–A–57 159060 (Nippon Denki KK).

Patent Abstracts of Japan, vol. 008, No. 081 (E–238), Apr. 13, 1984 & JP–A–59 002344 (Nippon Denki KK).

Patent Abstracts of Japan, vol. 014, No. 036 (E–877), Jan. 23, 1990 & JP–A–01 270346 (Fuji Electric Co. Ltd.).

* cited by examiner

METHOD OF MANUFACTURING AN INTEGRATED EDGE STRUCTURE FOR HIGH VOLTAGE SEMICONDUCTOR DEVICES, AND RELATED INTEGRATED EDGE STRUCTURE

This application is a divisional of U.S. application Ser. No. 09/457,069 filed Dec. 7, 1999 and which is now U.S. Pat. No. 6,300,171 and is divisional of U.S. application Ser. No. 09/703,263 filed Oct. 31, 2000 which is now abandoned.

BACKGROUND OF THE INVENTION

1. Field of the Invention

The present invention relates to a method of manufacturing an integrated edge structure for high voltage semiconductor devices, and to the related integrated edge structure.

2. Discussion of the Related Art

High voltage semiconductor devices, for example MOS-gated power devices, include PN junctions which must withstand high reverse voltage. Most of PN junctions fabricated by planar technology essentially consist of a first semiconductor region of a given conductivity type diffused into a second semiconductor region of opposite conductivity type.

A depletion region is associated with the PN junction, which can be considered as made up of two regions, a first one along the plane portion of the junction, a second one at the edges of said plane portion. The electric field has a different behavior in the two regions. In the plane portion the equipotential lines are parallel to the junction, the maximum electric field is located at the junction and the breakdown occurs when it reaches the critical value ECR. At the junction edges, because of the finite junction depth, the equipotential lines are curved, and spaced closer together than in the plane portion. As a consequence, the electric field increases, and higher electric fields are associated with smaller curvature radii, i.e. a shallower junction. The breakdown voltage of the edge portion of the PN diffused junction is usually lower than that of the corresponding plane portion of the junction, since the electric field in the edge region is much higher. The ratio between the breakdown voltage of the edge and the plane portion is thus below unity.

Several techniques have been developed to increase the ratio, essentially by changing the size of the depletion layer to avoid local increases in the electric field which can lead to early breakdown.

For example GB-A-2163597 describes a technique wherein one or more high resistivity rings are provided around the lateral edges of the junction; in this way the depletion layer spreads over wider regions, so that the spatial charge distribution is widened and the electric field is consequently reduced. The rings are formed by implantation and diffusion of dopants; by controlling the implanted dose and the diffusion process, it is possible to achieve the desired resistivity. Two or more concentric rings, with increasing resistivity from the inner to the outer one, are necessary when the device must withstand high reverse voltages. However, peaks in the electric field value are observed at the interface between two rings, and at the edge of the outer ring. An increase in the number of rings leads to larger spreading of the depletion layer, and the peaks in the electric field are lowered.

Other techniques used for reducing the electric field include rings with high junction depth, floating rings and so on.

In view of the state of the art described, it is an object of the present invention to provide a method of manufacturing an integrated edge structure for high voltage semiconductor devices.

SUMMARY OF THE INVENTION

According to the present invention, this and other objects are achieved by a method of manufacturing an edge structure for a high voltage semiconductor device, comprising a first step of forming a first semiconductor layer of a first conductivity type, a second step of forming a first mask over the top surface of said first semiconductor layer, a third step of removing portions of said first mask in order to form at least one opening in it, a fourth step of introducing dopant of a second conductivity type in said first semiconductor layer through said at least one opening, a fifth step of completely removing said first mask and of forming a second semiconductor layer of the first conductivity type over said first semiconductor layer, a sixth step of diffusing the dopant implanted in said first semiconductor layer in order to form a doped region of the second conductivity type in said first and second semiconductor layers, repeating at least one time the second step up to the sixth step in order to form a final edge structure comprising a number of superimposed semiconductor layers of the first conductivity type and at least two columns of doped regions of the second conductivity type, said columns being inserted in said number of superimposed semiconductor layers and formed by superimposition of said doped regions subsequently implanted through the mask openings, the column near said high voltage semiconductor device being deeper than the column farther from said high voltage semiconductor device.

BRIEF DESCRIPTION OF THE DRAWINGS

The features and advantages of the present invention will be made more evident by the following detailed description of a particular embodiment thereof, illustrated as a non limiting example in the annexed drawings, wherein.

DETAILED DESCRIPTION

Figure 1:
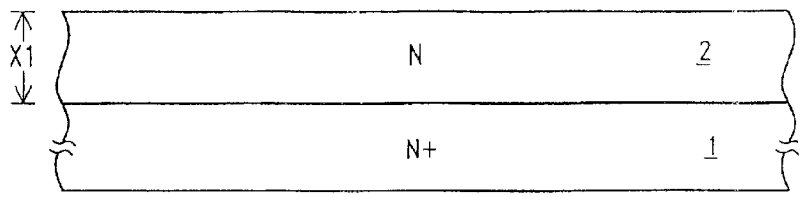
FIGS. 1 to 6 are cross-sectional views of a high voltage MOS-gated power device showing intermediate steps of a related manufacturing process.

Referring to FIG. 1, a lower semiconductor layer 2 of the N conductivity type is formed by means of an epitaxial growth over an N+ semiconductor substrate 1. Epitaxial layer 2 has a thickness X1 approximately equal to the size of the elementary functional units, be they cells or stripes, i.e., for example, 5 to 15 μm. The thickness X1 of epitaxial layer 2 is much lower, e.g. one third or less, than the overall thickness of the drain layer of the final device. The doping level of epitaxial layer 2 is higher than that required for assuring that the device keeps the desired high voltage. A doping level of $5\times10^{14}$–$3\times10^{15}$ atoms/cm$^3$ (5–10 ohm/cm) is suitable.

Figure 2:
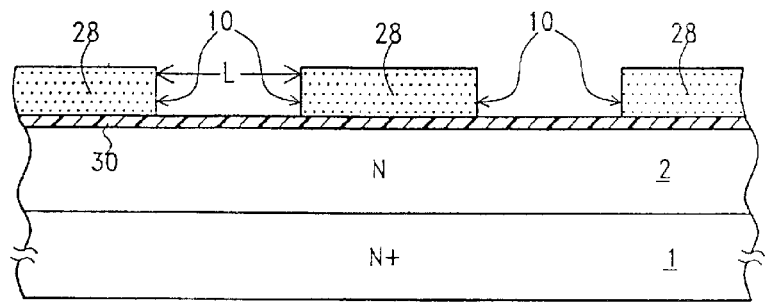

With reference to FIG. 2, an oxide layer 30 and a photoresist layer 28 are then formed over the top surface of epitaxial layer 2. The photoresist layer 28 is then selectively removed from the areas wherein the elementary cells or stripes will be formed, i.e. in openings 10. The size L of the openings 10 in the photoresist layer 28 is slightly lower than the size of the memory cells or stripes.

Figure 3:
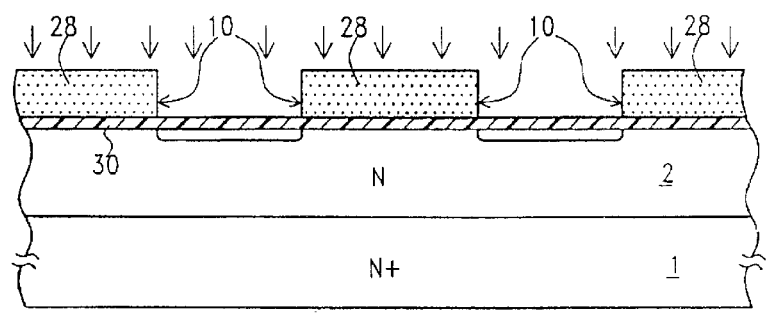

Referring to FIG. 3, a P type dopant such as boron or aluminum is then selectively implanted into the epitaxial layer 2, using the photoresist layer 28 as a mask. The oxide layer 30 has a thin thickness so that it does not prevent the ion implantation and protects the top surface of epitaxial layer 2 during the removal of the photoresist layer 28. A suitable implantation energy is in the range 100 to 900 keV. The implant dose is chosen in such a way that, after the thermal diffusion processes that will follow, the implanted P type dopant inverts the N type doping of the epitaxial layer 2. A suitable dose ranges from $5 \times 10^{11}$ to $1 \times 10^{13}$ atoms/cm$^2$.

Figure 4:
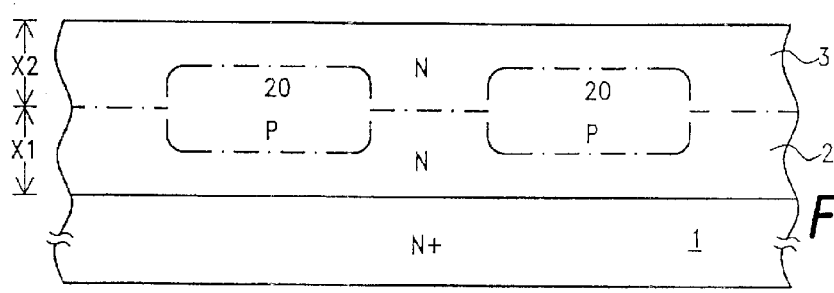

With reference to FIG. 4, the photoresist layer 28 and the oxide layer 30 are then completely removed, and an intermediate epitaxial layer 3 of the N conductivity type is formed over the lower epitaxial layer 2. Preferably, the thickness X2 of the intermediate epitaxial layer 3 and its dopant concentration are respectively similar to the thickness X1 and dopant concentration of the lower epitaxial layer 2. During the growth of the intermediate epitaxial layer 3, that as known involves a thermal process, the P type dopant previously implanted diffuses into the lower and intermediate epitaxial layers 2, 3, thus forming P regions 20 having dopant concentration approximately lower than or equal to $10^{15}$ atoms/cm$^3$.

Figure 5:
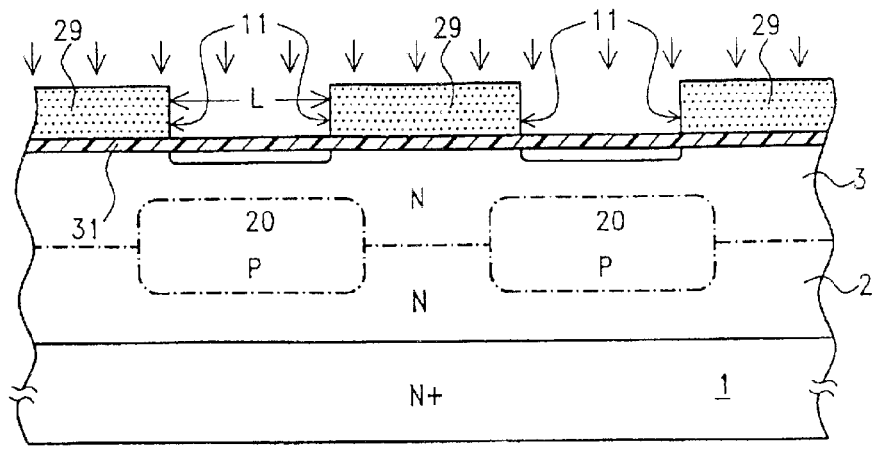

Referring to FIG. 5, another oxide layer 31 and photoresist layer 29 are then formed over the intermediate epitaxial layer 3. The photoresist layer 29 is then selectively removed using the same photolithographic mask previously used to remove the photoresist layer 28, and openings 11 are formed. A P type dopant such as boron or aluminum is then selectively implanted through the openings 11 using the photoresist layer 29 as a mask, as in the step depicted in FIG. 3. The implantation dose and energy are chosen in the same way as before.

Figure 6:
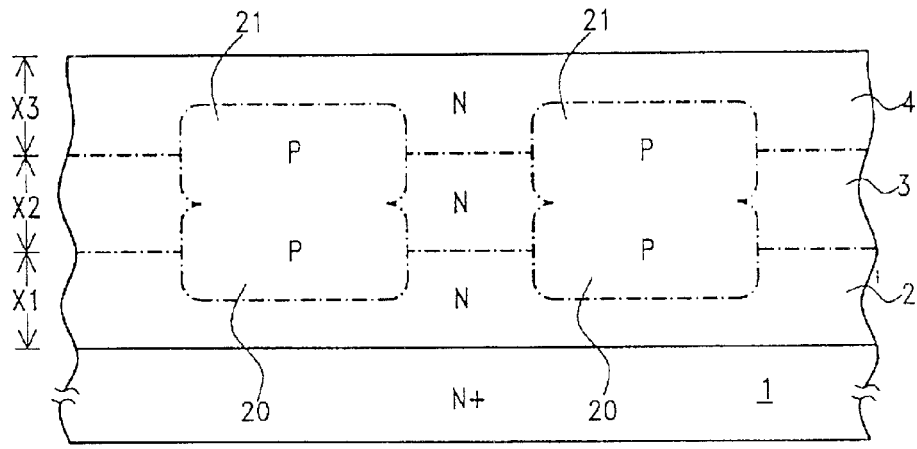

With reference to FIG. 6, the photoresist layer 29 and the oxide layer 31 are then completely removed, and an upper epitaxial layer 4 of the N conductivity type is formed over the intermediate epitaxial layer 3. Preferably, the thickness X3 and the dopant concentration of the upper epitaxial layer 4 are respectively similar to the thickness X2 and the dopant concentration of the intermediate epitaxial layer 3. During the growth of the upper epitaxial layer 4, that involves a thermal process, the P type dopant previously implanted diffuses into the intermediate and upper epitaxial layers 3, 4, to form P regions 20, and also regions 21 further diffuse vertically. In this way, P regions 20 and P regions 21 merge, forming columns of stacked P regions 20, 21. The dopant concentration of P regions 20 and 21, together with their geometrical disposition and size, is suitable to sustain the desired high voltage. In fact, the total charge amount in the P regions 20, 21 and in the N drain regions therebetween must be the same, and so there is a correlation between the geometrical size of the above-mentioned regions and their concentration.

Figure 7:
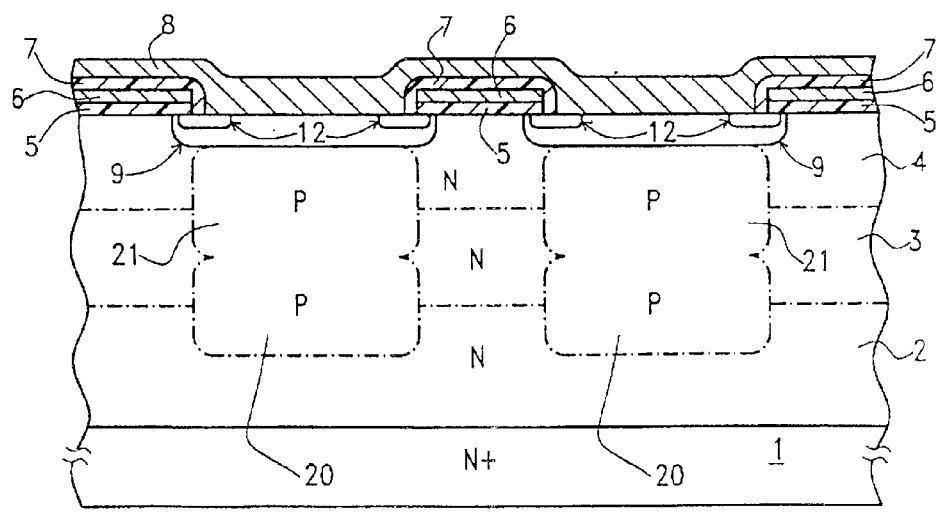
FIG. 7 shows in cross-section the high voltage MOS-gated power device obtained according to the manufacturing process steps of FIGS. 1 to 6.

The following process steps involve forming body regions 9 in the upper epitaxial layer 4, and source regions 12 inside the body regions 9. The top surface of the upper epitaxial layer 4 is covered by an insulated gate layer comprising a thin gate oxide layer 5 and a polysilicon layer 6. Openings are provided in the insulated gate layer over each body region 9. The insulated gate layer is covered by an insulating material layer 7 in which contact windows are provided over each body region 9 to allow a source metal layer 8 to contact the source regions 12 and the body regions 9, as shown in FIG. 7.

As an alternative, instead of performing, into each of the epitaxial layers 2 and 3 a single implant, several implants can be performed in succession into each of the epitaxial layers 2 and 3. Each implant of the succession is performed with a respective energy, so as to locate the peak dopant concentration at a respective depth. The dose of these implants ranges from $5 \times 10^{12}$ to $5 \times 10^{13}$ atoms/cm$^2$, and the energies range from 100 keV to 900 keV or more. For example, where the implanted dopant is boron, three implants at 300 keV, 600 keV and 900 keV can be performed, so as to have peak dopant concentrations located at a depth of 0.7 μm, 1.2 μm and 1.7 μm, respectively.

In this way, "box" shaped concentration profiles are obtained.

Clearly, the number of stacked epitaxial layers can be different from three. The number of epitaxial layers to be formed depends on the overall thickness of the drain layer of the final device, i.e., on the voltage to be sustained by the power device.

FIGS. 8 to 12 are cross-sectional views of a high voltage MOS-gated power device 100 and related edge structure 101, showing intermediate steps of a related manufacturing process, according to the present invention. All the process considerations described above, for example about the thickness and resistivity of the epitaxial layers or the dose and energy of the implantations, are valid even in this case.

The process steps are the same process steps described above, comprising a first, a second and a third oxide layer 32, 33, 34 and a first, a second and a third photoresist layer 37, 38, 39 used as manufacturing masks, the formations of superimposed N type semiconductor layers 41, 42, 43 over a N+ type semiconductor substrate 40, the related ion implantations of the P conductivity type for forming superimposed P doped regions 22, 23 in the semiconductor N layers.

Figure 8:
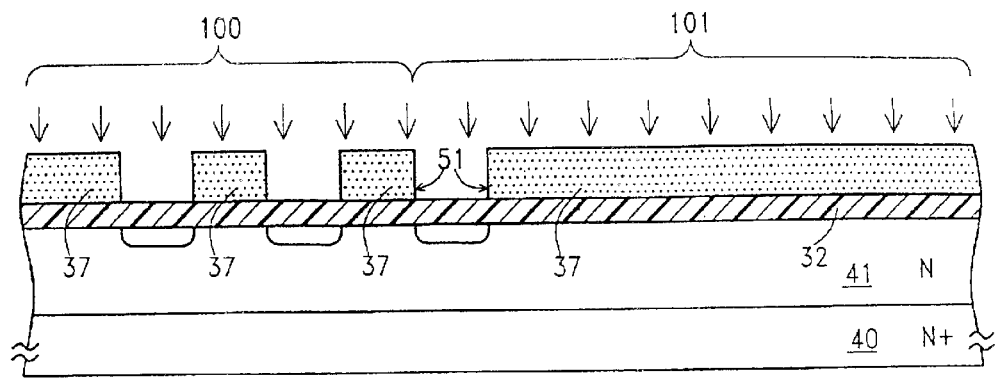
FIGS. 8 to 12 are cross-sectional views of a high voltage MOS-gated power device and related edge structure, showing intermediate steps of a related manufacturing process, according to the present invention.

The previously described manufacturing process is in this case also used to form an edge structure 101 for the power device 100. The edge structure 101 is obtained by the same manufacturing process, without adding any process step, but using modified masks for the P dopant implantations. Particularly, the mask 37 comprises a first opening 51 in the region wherein the edge structure 101 will be formed, this first opening 51 being located near the active area wherein the power device 100 will be formed (FIG. 8).

Figure 9:
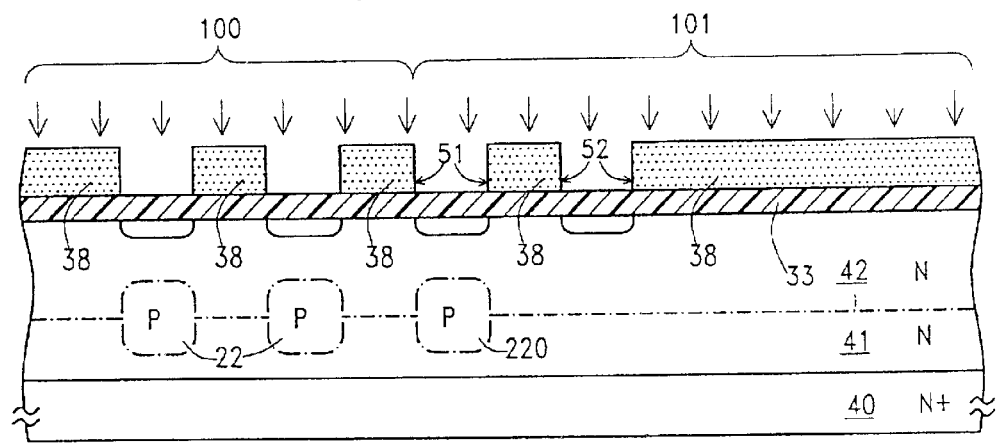

After the subsequent steps of implanting P type dopant, removing the mask 37 and the oxide layer 32, growing the N semiconductor layer 42, including thermal diffusion steps of the implanted dopant, a P doped region 220, similar to the P doped regions 22 in the active area 100, is obtained also in the edge structure area 101 near the active area 100 (FIG. 9).

In the next step, the second mask 38, superimposed to an oxide layer 33, is formed over the entire device and it comprises the same openings of the preceding mask 37 but also a second opening 52 in the edge structure area 101, suitably distanced from the first opening 51 (FIG. 9).

Figure 10:
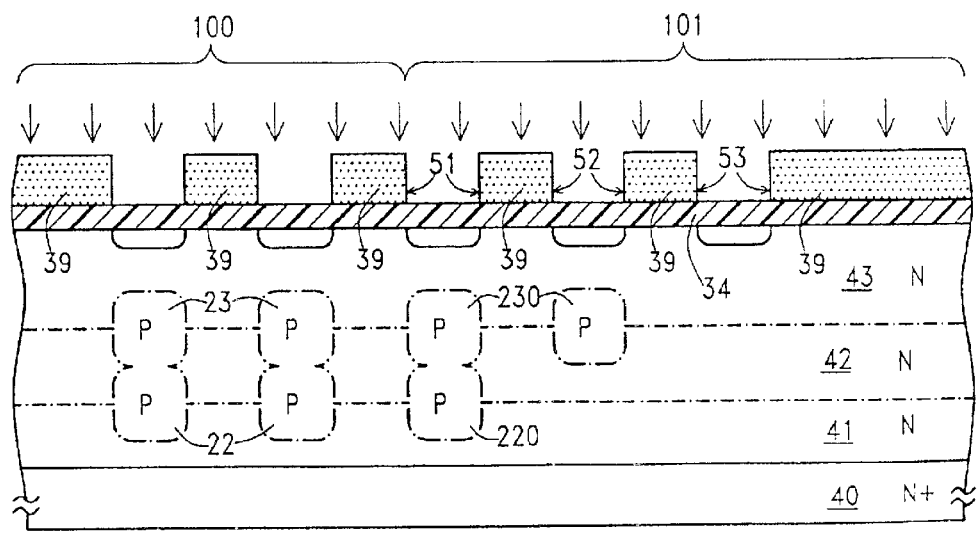

In this way, repeating the same process steps as above, two P doped regions 230 are formed in the edge structure area 101, one of them superimposed and merged to the preceding P doped region 220 in order to form one merged P doped region (FIG. 10).

Figure 11:
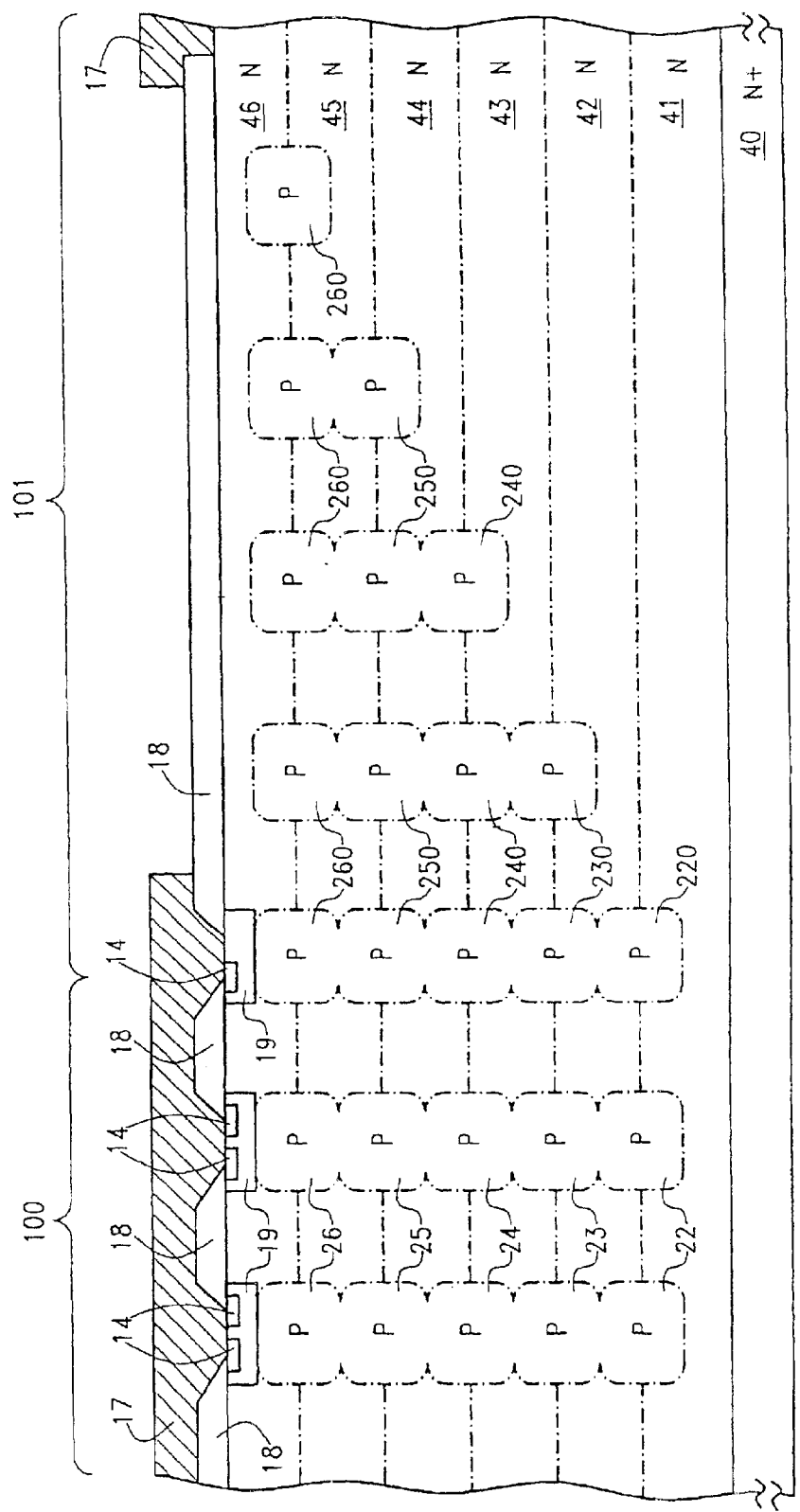

By repeating the same process steps and using every time a different photoresist mask having a new opening in the edge structure area 101 (e.g. the next mask 39 and its opening 53 in FIG. 10), a final device as shown in FIG. 11 is obtained. In this case, it provides six superimposed N semiconductor layers 41 to 46 and so five superimposed P doped regions 22 to 26 (merged in two singles "pockets") in the active area 100.

The final edge structure is constituted by a number (e.g. five) of P doped "columns", each column comprising merged superimposed P doped regions and having a different height, i.e. depth, in the N semiconductor layers (in proportion to the number of merged P doped regions in it). Particularly, the height of the P doped columns in the structure edge area 101 decreases shifting from the zone near the active area 100 to the outside (the outer column comprises only one P doped region 260). Moreover, the final device comprises also body regions 19, source regions 14, insulated gate layers 18, and metal layers 17 for electrical connections.

Figure 12:
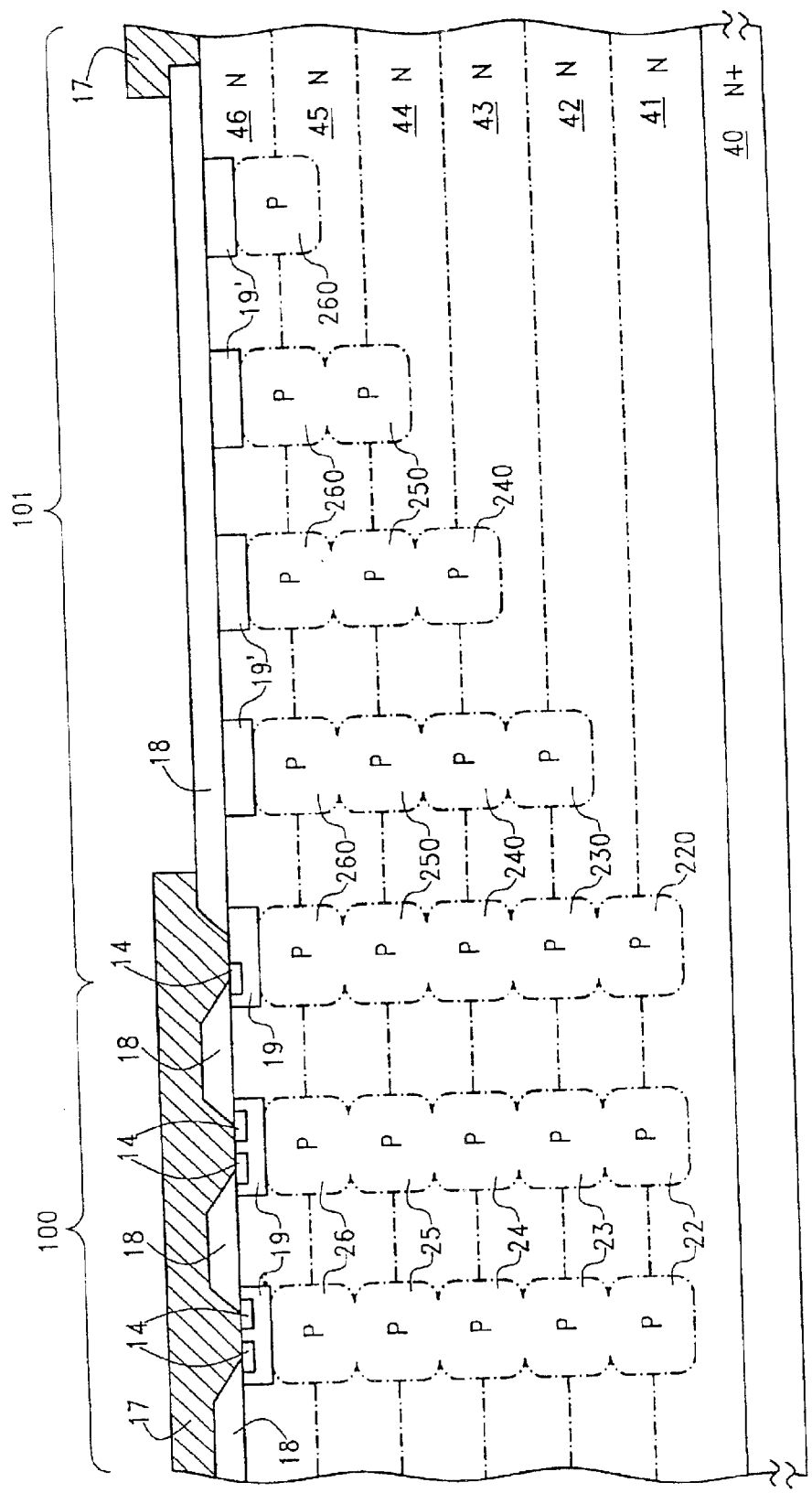

FIG. 12 shows another preferred final edge structure, very similar to that of FIG. 11, wherein the P doped columns in the structure edge area 101 have body regions 19' on their upper surfaces.

As an alternative, it is possible to grow epitaxial layers with higher thickness, possibly reducing the overall number of the same epitaxial layers, in order to obtain, both in the active area and in the edge structure area, stacked P regions not vertically merged to each other to form an unique P column. These not merged stacked P regions are, however, electrically connected due to the electric field applied during the device working.

Such edge structures are suitable to withstand a high voltage due to the very large radius of curvature obtained by means of the different depths of the P doped columns.

It is evident that the number of N type semiconductor layers can be different from six and so can that of the P doped regions inside them, depending on the overall thickness of the drain layer of the final device. i.e. on the voltage to be sustained by the power device.

It is moreover evident that such edge structures can be associated even with different power devices which do not provide such a manufacturing method as that shown in FIGS. 1 to 7.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claims is:

1. An integrated edge structure for a high voltage semiconductor device, comprising a number of superimposed semiconductor layers of a first conductivity type and at least two columns of doped regions of a second conductivity type, said columns disposed in said number of superimposed semiconductor layers, wherein, for each column of the at least two columns, the column is deeper than each column of the at least two columns that is farther from said high voltage semiconductor device than the column, and
    wherein each of the at least two columns is spaced from any other of the at least two columns.

2. The integrated edge structure according to claim 1, wherein said high voltage semiconductor device is a power MOSFET.

3. The integrated edge structure according to claim 1, wherein said number of superimposed semiconductor layers is superimposed on a semiconductor substrate.

4. The integrated edge structure according to claim 1, wherein each one of said at least two columns has a depth decreasing by shifting from said high voltage semiconductor device towards an outside of the integrated edge structure.

5. The integrated edge structure according to claim 1, wherein the doped regions of each one of said at least two columns are superimposed and vertically merged to each other.

6. The integrated edge structure according to claim 1, wherein the doped regions of each of said at least two columns are superimposed but not merged to each other.

7. The integrated edge structure according to claim 1, wherein said first conductivity type is N type and said second conductivity type is P type.

8. The integrated edge structure according to claim 1, wherein said first conductivity type is P type and said second conductivity type of conductivity is N type.

9. The integrated edge structure according to claim 1, wherein one or more doped regions of the at least two columns has a dopant concentration of approximately $1 \times 10^{15}$ atoms/cm$^2$ or less.

10. The integrated edge structure according to claim 1, wherein the number of superimposed semiconductor layers have a similar dopant concentration.

11. The integrated edge structure according to claim 1, wherein the number of superimposed semiconductor layers have a similar thickness.

12. An edge structure integrated with a semiconductor device in an integrated circuit, the edge structure comprising:
    a plurality of regions of one or more vertically superimposed sub-regions of a first conductivity type, each region laterally spaced from any other regions of the plurality of regions, each region disposed a respective lateral distance from the semiconductor device, and each region having a depth relative to a surface of the integrated circuit,
    wherein, for each region of the plurality of regions, a depth of a deepest sub-region of the region is deeper than a depth of a deepest sub-region of any other region of the plurality of regions that is disposed a farther lateral distance from the semiconductor device than the region is disposed, and
    wherein the edge structure further comprises a plurality of layers of a second conductivity type superimposed on one another, wherein each region of the plurality of regions is disposed within at least two of the plurality of superimposed layers.

13. The edge structure of claim 12, wherein each sub-region of each region is a doped semiconductor.

14. The edge structure of claim 13, wherein each of the plurality of sub-regions of the plurality of regions has a dopant concentration of approximately $1 \times 10^{15}$ atoms/cm$^2$ or less.

15. The edge structure of claim 12, wherein each region of the plurality of regions is spaced from each of the other of the plurality of regions by portions of two or more of the plurality of superimposed layers.

16. The edge structure of claim 12, wherein the plurality of superimposed layers is superimposed on a semiconductor substrate.

17. The edge structure of claim 12, wherein the plurality of superimposed layers have a similar dopant concentration.

18. The edge structure of claim 12, wherein the plurality of superimposed layers have a similar thickness.

19. The edge structure of claim 12, wherein the semiconductor device is a high-voltage semiconductor device.

20. The edge structure of claim 19, wherein the semiconductor device is a power MOSFET.

21. The edge structure of claim 12, wherein, for one or more of the plurality of regions, the plurality of superimposed sub-regions are merged together.

22. The edge structure of claim 12, wherein, for one or more of the plurality of regions, the plurality of superimposed sub-regions are not merged together.

23. The edge structure of claim 12, wherein the first conductivity type is N type and the second conductivity type is P type.

24. The edge structure of claim 12, wherein the first conductivity type is P type and the second conductivity type is N type.

25. An edge structure integrated with a semiconductor device in an integrated circuit, the edge structure comprising:

a plurality of regions of one or more vertically superimposed sub-regions of a first conductivity type, each region laterally spaced from any other regions of the plurality of regions, each region disposed a respective lateral distance from the semiconductor device, and each region having a depth relative to a surface of the integrated circuit, wherein, for each region of the plurality of regions, a depth of a deepest sub-region of the region is deeper than a depth of a deepest sub-region of any other region of the plurality of regions that is disposed a farther lateral distance from the semiconductor device than the region is disposed, wherein the semiconductor device includes a PN junction having an associated depletion region including an edge portion, and wherein the edge structure increases a breakdown voltage of the edge portion of the depletion region.

26. An edge structure integrated with a semiconductor device in an integrated circuit, the edge structure comprising:

a plurality of regions of one or more vertically superimposed sub-regions of a first conductivity type, each region laterally spaced from any other regions of the plurality of regions, each region disposed a respective lateral distance from the semiconductor device, and each region having a depth relative to a surface of the integrated circuit, wherein, for each region of the plurality of regions, a depth of a deepest sub-region of the region is deeper than a depth of a deepest sub-region of any other region of the plurality of regions that is disposed a farther lateral distance from the semiconductor device than the region is disposed, wherein the semiconductor device includes a PN junction having an associated depletion region including an edge portion, and wherein the edge structure increases a breakdown voltage of the edge portion of the depletion region.

27. An edge structure integrated with a semiconductor device in an integrated circuit, the edge structure comprising:

a plurality of regions of one or more vertically superimposed sub-regions of a first conductivity type, each region laterally spaced from any other regions of the plurality of regions, each region disposed a respective lateral distance from the semiconductor device, and each region having a depth relative to a surface of the integrated circuit, wherein, for each region of the plurality of regions, a depth of a deepest sub-region of the region is deeper than a depth of a deepest sub-region of any other region of the plurality of regions that is disposed a farther lateral distance from the semiconductor device than the region is disposed, wherein the semiconductor device includes a PN junction having an associated depletion region including an edge portion, and wherein the edge structure increases a breakdown voltage of the edge portion of the depletion region.

28. An edge structure integrated with a semiconductor device in an integrated circuit, the edge structure comprising:

a plurality of regions of one or more vertically superimposed sub-regions of a first conductivity type, each region laterally spaced from any other regions of the plurality of regions, each region disposed a respective lateral distance from the semiconductor device, and each region having a depth relative to a surface of the integrated circuit, wherein, for each region of the plurality of regions, a depth of a deepest sub-region of the region is deeper than a depth of a deepest sub-region of any other region of the plurality of regions that is disposed a farther lateral distance from the semiconductor device than the region is disposed, wherein the semiconductor device includes a PN junction having an associated depletion region including an edge portion, and wherein the edge structure increases a breakdown voltage of the edge portion to a breakdown voltage of plane portion.

* * * * *

UNITED STATES PATENT AND TRADEMARK OFFICE
CERTIFICATE OF CORRECTION

PATENT NO. : 6,809,383 B2
DATED : October 26, 2004
INVENTOR(S) : Ferruccio Frisina It is certified that error appears in the above-identified patent and that said Letters Patent is hereby corrected as shown below:

Title page,
Item [62], Related U.S. Application Data, should read:
-- [62] Division of application No. 09/457,069 filed Dec. 7, 1999, now U.S. Pat. No. 6,300,171. --

Signed and Sealed this

First Day of February, 2005

JON W. DUDAS
*Director of the United States Patent and Trademark Office*

UNITED STATES PATENT AND TRADEMARK OFFICE
CERTIFICATE OF CORRECTION

PATENT NO. : 6,809,383 B2  
DATED : October 26, 2004  
INVENTOR(S) : Ferruccio Frisina Page 1 of 1

It is certified that error appears in the above-identified patent and that said Letters Patent is hereby corrected as shown below:

<u>Column 8,</u>  
Line 4, should read:  
-- wherein the edge structure increases curvature radii of equipotential lines associated with --.  
Lines 27-28, should read:  
-- wherein the edge structure decreases an electric field associated with the edge portion of the deletion layer. --.  
Lines 49-50, should read:  
-- edge portion and a plane portion, and  
Wherein the edge structure reduces a ratio of a breakdown voltage --.

Signed and Sealed this

Tenth Day of January, 2006

JON W. DUDAS  
*Director of the United States Patent and Trademark Office*